US010636952B2

(12) United States Patent
Takagi et al.

(10) Patent No.: US 10,636,952 B2
(45) Date of Patent: Apr. 28, 2020

(54) FLEXIBLE PELTIER DEVICE AND TEMPERATURE REGULATION APPARATUS

(71) Applicant: ASAHI FR R&D CO., LTD., Saitama-shi, Saitama (JP)

(72) Inventors: Kazuhisa Takagi, Saitama (JP); Koichi Abe, Saitama (JP); Nobuyoshi Watanabe, Saitama (JP); Syuhei Toyoshima, Saitama (JP)

(73) Assignee: ASAHI FR R&D CO., LTD., Saitama-shi (JP)

( * ) Notice: Subject to any disclaimer, the term of this patent is extended or adjusted under 35 U.S.C. 154(b) by 0 days.

(21) Appl. No.: 15/535,527

(22) PCT Filed: Jan. 8, 2016

(86) PCT No.: PCT/JP2016/050530
§ 371 (c)(1),
(2) Date: Jun. 13, 2017

(87) PCT Pub. No.: WO2016/111359
PCT Pub. Date: Jul. 14, 2016

(65) Prior Publication Data
US 2017/0352794 A1     Dec. 7, 2017

(30) Foreign Application Priority Data
Jan. 9, 2015   (JP) .................................. 2015-003292

(51) Int. Cl.
*H01L 35/32* (2006.01)
*B32B 25/20* (2006.01)
(Continued)

(52) U.S. Cl.
CPC ............. *H01L 35/32* (2013.01); *B32B 25/20* (2013.01); *B32B 27/18* (2013.01); *B32B 27/20* (2013.01);
(Continued)

(58) Field of Classification Search
CPC ..... H01L 35/32; H01L 35/08; B60H 1/00478; F25B 1/02
See application file for complete search history.

(56) References Cited

U.S. PATENT DOCUMENTS

2002/0113246 A1* 8/2002 Nagai ................... F21K 9/90
257/99
2011/0171480 A1* 7/2011 Mori ................... B32B 9/005
428/447

(Continued)

FOREIGN PATENT DOCUMENTS

EP     2 327 544 A1    6/2011
JP    2007-153026 A    6/2007
(Continued)

OTHER PUBLICATIONS

Mar. 15, 2016 International Search Report issued with International Patent Application No. PCT/JP2016/050530.
(Continued)

*Primary Examiner* — Brian M King
(74) *Attorney, Agent, or Firm* — Oliff PLC (57) ABSTRACT

A flexible Peltier device in which emitting heat conversion properties between Peltier elements and an object transferring heat may be improved and a flexible heat-emitting sheet having the Peltier elements bonded thereto may be bent without worrying the separation there between. A flexible Peltier device includes a single or plural Peltier element which is disposed on one surface side of a heat-emitting sheet having flexibility made from heat-conductive rubber containing a heat conductive filler and each semiconductor element which has a heating side and a cooling side and composes the Peltier element at least one of the heating side and the cooling side is bonded integrally to the heat-emitting sheet by a direct covalent bond and/or by an indirect covalent bond through a molecular adhesive at active groups existing on each other surfaces.

6 Claims, 7 Drawing Sheets

(51) Int. Cl.
  *H01L 35/08* (2006.01)
  *B32B 27/18* (2006.01)
  *B32B 27/20* (2006.01)
  *B60H 1/00* (2006.01)
  *H01L 35/30* (2006.01)

(52) U.S. Cl.
  CPC ......... *B60H 1/00478* (2013.01); *H01L 35/08* (2013.01); *B32B 2307/302* (2013.01); *H01L 35/30* (2013.01)

(56) References Cited

U.S. PATENT DOCUMENTS

| | | | |
|---|---|---|---|
| 2013/0177770 A1 | 7/2013 | Mori et al. | |
| 2013/0180354 A1* | 7/2013 | Maranville | B62D 1/065 74/552 |
| 2016/0325278 A1* | 11/2016 | Takagi | G01N 27/44791 |

FOREIGN PATENT DOCUMENTS

| | | | |
|---|---|---|---|
| JP | 2009-302168 A | | 12/2009 |
| JP | 2009302168 A | * | 12/2009 |
| JP | 2014-146640 A | | 8/2014 |
| WO | 2012-043631 A1 | | 4/2012 |

OTHER PUBLICATIONS

May 10, 2017 Office Action issued in Japanese Patent Application No. 2016-568759.
Jul. 21, 2017 Office Action issued in Japanese Patent Application No. 2016-568759.
Mar. 15, 2016 International Preliminary Report on Patentability issued in International Patent Application No. PCT/JP2016/050530.
Sep. 3, 2018 Extended Search Report issued in European Patent Application No. 16735098.2.

* cited by examiner

FLEXIBLE PELTIER DEVICE AND TEMPERATURE REGULATION APPARATUS

TECHNICAL FIELD

The present invention relates to a Peltier device in which plural Peltier elements are disposed on a heat-emitting sheet having flexibility and a temperature regulation apparatus utilizing exothermic and cooling phenomena of the Peltier element caused by application of voltage.

BACKGROUND OF THE ART

A Peltier element, in which a P-type semiconductor element and a N-type semiconductor element are connected in series on one surface side of a ceramics substrate, has been used in a heating and cooling apparatus as a heating source or a cooling source. Such a prior conventional Peltier element has lacked flexibility. Following Patent Document 1 discloses that a thermoelectric convertor comprises plural Peltier elements, in which thin-filmed P-type and N-type semiconductor elements formed by a vacuum deposition method, a sputter method and the like, are connected in series; an electrical insulation sheet having flexibility which is made from an insulating resin such as polyimide resin, polyethylene terephthalate resin etc., has the plural Peltier elements disposed on one surface side thereof through a predetermined distance, and is bent in wave shape so that the each Peltier element is positioned at a slope face thereof; a thermal conversion sheet provided with the electrical insulation sheet; and a tube which is inserted in triangular space formed by the wave-shaped electrical insulation sheet and conducts heat conversion.

PRIOR ART DOCUMENT

Patent Document

[Patent Document 1] Japanese Application Publication No. 2014-146640A

SUMMARY OF THE INVENTION

Problems to be Solved by the Invention

According to the thermoelectric convertor which is disclosed in Patent Document 1, the electrical insulation sheet having flexibility, which is made from the insulating resin such as the polyimide resin etc. and has the thin-filmed Peltier elements disposed thereon, may be bent in the wave shape. Unfortunately, the insulating resin such as the polyimide resin etc. has poor heat transfer properties, and could decrease heat conversion properties between the Peltier elements and the tube which conducts the heat conversion. Further, bonding force between the electrical insulation sheet and the Peltier elements is insufficient. When the Peltier elements are bent by bending the electrical insulation sheet in the wave shape, the electrical insulation sheet and the Peltier elements could separate therebetween by a stress applied to the Peltier elements. According to the thermoelectric convertor disclosed in Patent Document 1, the Peltier elements are positioned at the slope face of the electrical insulation sheet bent in the wave shape so as to avoid bending of the Peltier elements when bending of the electrical insulation sheet.

The present invention was made in view of solving the above described problems, and its object is to provide a flexible Peltier device in which emitting heat conversion properties between Peltier elements and an object transferring heat may be improved and a flexible heat-emitting sheet having the Peltier elements bonded thereto may be bent without worrying the separation therebetween, and a temperature regulation apparatus.

Means for Solving Problems

A flexible Peltier device of the present invention developed to achieve the objects described above comprises a single or plural Peltier element which is disposed on one surface side of a heat-emitting sheet having flexibility made from heat-conductive rubber containing a heat conductive filler and each semiconductor element which has a heating side and a cooling side and composes the Peltier element; at least one of the heating side and the cooling side is bonded integrally to the heat-emitting sheet by a direct covalent bond and/or by an indirect covalent bond through a molecular adhesive at active groups existing on each other surfaces.

A temperature regulation apparatus developed to achieve the objects described above comprises the flexible Peltier device which is capable of being attached to accommodate a curved surface of a temperature adjustment object.

In a distance between the Peltier elements, when the distance is too short, the flexibility of the Peltier device is tended to detract. And when the distance is too long, it is tended to be difficult regulation of temperature. The preferred distance is 1 to 10 times of a side length of the Peltier element (more preferably 2 to 5 times thereof). It is preferable that the heat emitting sheet of the flexible Peltier device, which is attached to the temperature adjustment object, may be softened.

When the heat-conductive rubber is silicone rubber containing a metal oxide and/or a metal nitride as the heat conductive filler and thermal conductivity of the heat-emitting sheet is 1 W/m·K or more, heat conversion properties between the Peltier device and the temperature adjustment object may be improved.

When a thickness of the heat-emitting sheet is too thin, processing thereof is tended to be difficult. And when the thickness thereof is too thick, thermal conductance thereof is tended to decrease. The preferred thickness of the heat-emitting sheet is 0.01 to 10 mm (more preferably 0.05 to 2 mm). The heat-emitting sheet may have the flexibility and strength.

When the heat-emitting sheet is bonded to both sides of the cooling side and the heating side of the each semiconductor element which composes the Peltier element by a molecular adhesive treatment, any side surface of either the cooling side or the heating side of the flexible Peltier device may be attached to accommodate the curved surface of the temperature adjustment object. Further when the temperature adjustment object has a concave-convex surface, the heat-emitting sheet having the flexibility can accommodate the concave-convex surface and adhere thereto and thus, the heat conversion properties may be improved.

In the temperature regulation apparatus, the Peltier element and the heat-emitting sheet are preferably bonded and integrated by the covalent bond formed at least one of a dry-type treatment and the molecular adhesive treatment at least one of the surfaces thereof; and the dry-type treatment is at least one selected from the group consisting of a corona treatment, a plasma treatment and an ultra violet treatment.

Effects of the Invention

According to the flexible Peltier device of the present invention, the heat transfer properties between the Peltier elements and an object to conduct heat can be improved. When the heat-emitting sheet having the flexibility is bent, a problem of separation between the each semiconductor element and the heat-emitting sheet is dissolved. According to the temperature regulation apparatus of the present invention using the flexible Peltier device, the flexible Peltier device can be bent and attached to accommodate the curved surface of the an temperature adjustment object while avoiding the separation between the each semiconductor element which composes the Peltier elements and the heat-emitting sheet. Since the heat transfer properties of the heat-emitting sheet are improved, a temperature of the temperature adjustment object can be regulated smoothly.

MODE FOR CARRYING OUT THE INVENTION

Hereunder, embodiments to practice the present invention in detail will be explained, but the scope of the present invention is not restricted by these embodiments.

Figure 1:
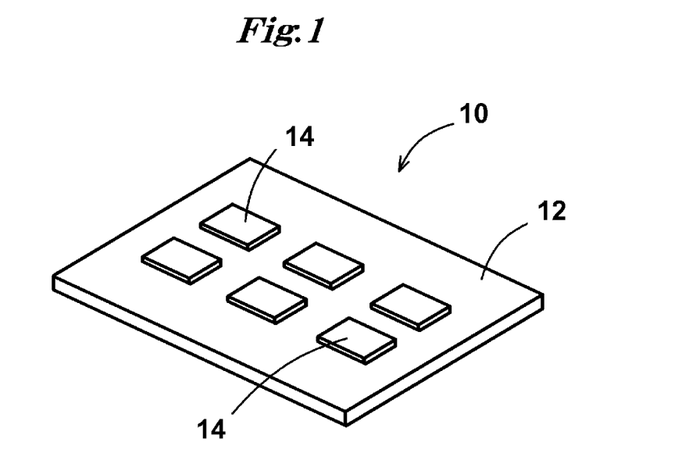
FIG. 1 is a perspective view showing an embodiment of the flexible Peltier device of the present invention.

An embodiment of a flexible Peltier device of the present invention is shown in FIG. 1. In the flexible Peltier device 10 shown in FIG. 1, plural Peltier elements 14 are disposed each other on one surface side of a heat-emitting sheet 12 through intervals with a predetermined distance. The heat-emitting sheet 12 is made from heat-conductive rubber containing a heat-conductive filler and has flexibility. In the heat-conductive rubber, the heat conductive filler is contained in a rubber constituent. As the heat conductive filler, magnesium oxide (MgO), aluminum oxide ($Al_2O_3$), aluminum nitride (AlN), boron nitride (BN), silicon nitride ($Si_3N_4$), diamond, carbon, fullerene and carbon graphite or combinations of any two or more thereof may be exemplified. A content of the heat emitting filler is preferably 50 to 95% by weight (more preferably 65 to 90% by weight).

The rubber constituent is made from rubber composition including at least rubber material. As the rubber material, silicone rubber, ethylene-propylene-diene copolymer rubber (EPDM), urethane rubber and fluoro-rubber may be exemplified. In these rubber materials, the silicone rubber is preferably used from viewpoints of improving softness, tackiness and conformability, and EPDM is preferably used from viewpoints of decreasing gas permeability and increasing water-proofness.

A main component of the silicone rubber of the rubber material may be peroxide crosslinking type silicone rubber, addition crosslinking type silicone rubber and condensation crosslinking type silicone rubber or blended rubber made from the silicone rubber and olefin type rubber. When the heat-emitting sheet 12 made from the silicone rubber is used, the high softness is achieved at a wide temperature range such as −40 to 200° C. and flex fatigue resistance and conformability may be improved and expansion by heat shock may be prevented. The silicone rubber has number average molecular weight of 10,000 to 1,000,000.

The peroxide crosslinking type silicone rubber is not specifically limited as far as the rubber synthesized from a silicone raw compound which is crosslinked by a peroxide type crosslinking agent. Particularly, polydimethylsiloxane, vinylmethylsiloxane/polydimethylsiloxane copolymer, vinyl-terminated polydimethylsiloxane, vinyl-terminated diphenylsiloxane/polydimethylsiloxane copolymer, vinyl-terminated diethylsiloxane/polydimethylsiloxane copolymer, vinyl-terminated trifluoropropylmethylsiloxane/polydimethylsiloxane copolymer, vinyl-terminated polyphenylmethylsiloxane, vinylmethylsiloxane/dimethylsiloxane copolymer, trimethylsiloxane group-terminated dimethylsiloxane/vinylmethylsiloxane copolymer, trimethylsiloxane group-terminated dimethylsiloxane/vinylmethylsiloxane/diphenylsiloxane copolymer, trimethylsiloxane group-terminated dimethylsiloxane/vinylmethylsiloxane/ditrifluoropropylmethylsiloxane copolymer, trimethylsiloxane group-terminated polyvinylmethylsyloxane, methacryloxypropyl group-terminated polydimethylsiloxane, acryloxypropyl group-terminated polydimethylsiloxane, (methacryloxypropyl)methylsiloxane/dimethylsiloxane copolymer and (acryloxypropyl)methylsiloxane/dimethylsiloxane copolymer may be exemplified.

As the peroxide type crosslinking agent which is coexisted therewith, for example, ketone peroxides, diacyl peroxides, hydroperoxides, dialkylperoxides, peroxyketals, alkylperesters, percarbonates may be exemplified. More particularly, ketoneperoxide, peroxyketal, hydroperoxide, dialkylperoxide, peroxycarbonate, peroxyester, benzoylperoxide, dicumylperoxide, dibenzoylperoxide, tert-butylhydroperoxide, di-tert-butyl hydroperoxide, di(dicyclobenzoyl)peroxide, 2,5-dimethyl-2,5-bis(tert-butylperoxy)hexane, 2,5-dimethyl-2,5-bis(tert-butylperoxy)hexyne, benzophenone, Michler's ketone, dimethylaminobenzoic acid ethyl ester and benzoin ethyl ether may be exemplified.

The amount to be used as the peroxide type crosslinking agent can be arbitrarily determined depending on properties of the silane-coupling agent which is optionally used, and properties of the heat-emitting sheet 12 which is made from the silicone rubber or kinds of the silicone rubber prepared. As the peroxide type crosslinking agent, 0.01 to 10 parts by mass, more preferably 0.1 to 2 parts by mass relative to 100 parts by mass of silicone rubber can be preferably used. If the amount is less than this range, crosslink density is excessively low to give undesired properties as the silicone rubber. If the amount is more than this range, crosslink density is excessively high and elasticity of the silicone rubber is decreased.

The addition crosslinking type silicone rubber can be obtained from below composites. As the composites, composites containing polysiloxane having vinyl groups synthesized in the presence of a Pt catalyst and polysiloxane having H groups are included. As polysiloxane having the vinyl group, vinylmethyl siloxane/polydimethyl siloxane copolymer, vinyl-terminated polydimethylsiloxane, vinyl-terminated diphenylsiloxane/polydimethylsiloxane copolymer, vinyl-terminated diethylsiloxane/polydimethylsiloxane copolymer, vinyl-terminated trifluoropropylmethylsiloxane/polydimethylsiloxane copolymer, vinyl terminated polyphenylmethylsiloxane, vinylmethylsiloxane/dimethylsiloxane copolymer, trimethylsiloxane group-terminated dimethylsiloxane/vinylmethylsiloxane/diphenylsiloxane copolymer, trimethylsiloxane group-terminated dimethylsiloxane/vinylmethylsiloxane/ditrifluoropropylmethylsiloxane copolymer and trimethylsiloxane group-terminated polyvinylmethylsiloxane are included. As polysiloxane having the H group, H-terminated polysiloxane, methyl H siloxane/dimethylsiloxane copolymer, polymethyl H siloxane, polyethyl H siloxane, H-terminated polyphenyl(dimethyl H siloxy)siloxane, methyl H siloxane/phenylmethylsiloxane copolymer and methyl H siloxane/octylmethylsiloxane copolymer are included.

As other composites for synthesis of the addition crosslinking type silicone rubber, composites containing polysiloxane having amino groups, and polysiloxane having epoxy groups or polysiloxane having acid anhydride groups or compounds having isocyanate groups are included. As the polysiloxane having the amino groups, aminopropyl-terminated polydimethylsiloxane, aminopropylmethylsiloxane/dimethylsiloxane copolymer, aminoethylaminoisobutylmethylsiloxane/dimethylsiloxane copolymer, aminoethylaminopropylmethoxysiloxane/dimethylsiloxane copolymer and dimethylamino-terminated polydimethylsiloxane are included. As the polysiloxane having the epoxy groups, epoxypropyl-terminated polydimethylsiloxane and (epoxycyclohexylethyl)methylsiloxane/dimethylsiloxane copolymer are included. As the polysiloxane having the acid anhydride groups, succinic acid anhydride-terminated polydimethylsiloxane is included. As the compounds having the isocyanate groups, toluyldiisocyanate and 1,6-hexamethylene diisocyanate are included.

When the heat-conductive rubber is prepared from the above composites, the composites and the heat conductive filler are kneaded, and the resultant mixture is heated at a specific temperature for a specific time. The heat-conductive rubber is finally obtained. Processing conditions to prepare such as the heating temperature and the heating time cannot be determined unambiguously because the processing conditions vary with the kinds and characteristics of addition reactions. The general processing conditions of heating are at 0 to 200° C. for 1 minute to 24 hours. According to the processing conditions, the addition crosslinking type silicone rubber having thermal conductance, in which the heat conductive filler is contained, may be obtained. In cases where preparation is carried out at a low temperature to obtain a silicone rubber having good physical properties, the reaction time should be lengthened. In cases where productivity is more emphasized rather than the physical properties, the preparation should be carried out at a higher temperature for a shorter period of time. If the preparation should be carried out within a certain period of time in compliance with the production processes or working conditions, the preparation should be carried out at a comparatively higher temperature within the range to meet a desired period of processing time.

The condensation crosslinking type silicone rubber can be obtained by synthesis using below composites. As the composites, a composite of a homocondensation component consisting of silanol group-terminated polysiloxanes which is prepared in the presence of a tin type catalyst, a composite of silanol group-terminated polysiloxanes and crosslinking agents, or a composite of the silanol group-terminated polysiloxanes and terminal-bloked polysiloxanes.

As silanol group-terminated polysiloxanes, silanol-terminated polydimethylsiloxane, silanol-terminated polydiphenylsiloxane, silanol-terminated polytrifluoromethylsiloxan and silanol-terminated diphenyl siloxane/dimethylsiloxane copolymer are included.

As the crosslinking agents, tetraacetoxysilane, triacetoxymethylsilane, di t-butoxydiacetoxysilane, vinyltriacetoxysilane, tetraethoxysilane, triethoxymethylsilane, bis(triethoxysilyl)ethane, tetra-n-propoxysilane, vinyltrimethoxysilane, methyltris(methylethylketoxim)silane, vinyltris(methylethylketoximino)silane, vinyltriisopropenoxysilane, triacetoxymethylsilane, tri(ethylmethyl)oximmethylsilane, bis(N-methylbenzoamido)ethoxymethylsilane, tris(cyclohexylamino)methylsilane, triacetoamidomethylsilane and tridimethylamino methylsilane are included.

As terminal-blocked polysiloxanes, hloro-terminated polydimethylsiloxane, diacetoxymethyl-terminated polydimethylsiloxane and terminal-blocked polysiloxane are included.

When the condensation crosslinking type silicone rubber having thermal conductance, which contains the heat conductive filler, is prepared from the composites, the composites and the heat conductive filler are mixed, and the resultant mixture is heated at a specific temperature for a specific time. The condensation crosslinking type silicone rubber is finally obtained. Processing conditions to prepare such as the heating temperature and the heating time cannot be determined unambiguously because the processing conditions vary with the kinds and characteristics of condensation reactions. The general processing conditions of heating are at 0 to 200° C. for 1 minute to 24 hours. In cases where preparation is carried out at a low temperature to obtain a silicone rubber having good physical properties, the reaction time should be lengthened. In cases where productivity is more emphasized rather than the physical properties, the preparation should be carried out at a higher temperature for a shorter period of time. If the preparation should be carried out within a certain period of time in compliance with the production processes or working conditions, the preparation should be carried out at a comparatively higher temperature within the range to meet a desired period of processing time.

The heat-conductive rubber may be the blended rubber made from the silicone rubber and non-silicone rubber. The olefin type rubber and crosslinks containing a rubber-like raw material substance are exemplified as non-silicone rubber. As the olefin type rubber, 1, 4-cis-butadiene rubber, isoprene rubber, styrene-butadiene copolymer rubber, polybutene rubber, polyisobutylene rubber, ethylene-propylene rubber, ethyl ene-propyl ene-di ene rubber, chlorinated ethylene-propylene rubber and chlorinated butyl rubber are included. As the crosslinks, natural rubber, 1,4-cis butadiene rubber, isoprene rubber, polychloroprene, styrene-butadiene copolymer rubber, hydrogenated styrene-butadiene copolymer rubber, acrylonitrile-butadiene copolymer rubber, hydrogenated acrylonitrile-butadiene copolymer rubber, polybutene rubber, polyisobutylene rubber, ethylene oxide-epichlorohydrin copolymer rubber, chlorinated polyethylene rubber, chlorosulfonated polyethylene rubber, alkylated chlorosulfonated-polyethylene rubber, chloroprene rubber, chlorinated acryl rubber, brominated acryl rubber, fluoro rubber, epichlorohydrin rubber and its copolymer rubber, brominated butyl rubber, homopolymer rubber or two- or three-dimensional co- or ter-polymer rubber using such a monomer as tetrafluoroethylene, hexafluoropropylene, vinylidene fluoride and tetrafluoroethylene, ethylene/tetrafluoroethylene copolymer rubber, propylene/tetrafluoroethylene copolymer rubber, ethylene-acryl rubber, epoxy rubber, urethane rubber, liner polymer of both terminals unsaturated-group elastomer etc. are included. These rubbers may be used solely or mixture thereof.

As other rubber materials, ethylene-propylene-diene copolymer rubber, urethane rubber and fluoro rubber may be exemplified.

The heat-emitting sheet 12 made from the heat-conductive rubber has flexibility. When a thickness thereof is too thin, processing thereof is tended to be difficult. And when the thickness thereof is too thick, thermal conductance thereof is tended to decrease. The preferred thickness of the heat-emitting sheet 12 is 0.01 to 10 mm (more preferably 0.05 to 2 mm). When the heat-emitting sheet 12 has the thickness less than 0.01 mm, strength thereof is insufficient and processing thereof is tended to be difficult. The heat-emitting sheet 12 having the thickness more than 10 mm exhibits insufficient flexibility and poor thermal conductance. In addition, the heat-emitting sheet 12 preferably has thermal conductivity of 1 W/(m·K) or more (more preferably 1 to 5 W/(m K)). When the heat-emitting sheet 12 having the thermal conductivity less than 1 W/(m K) is used, the thermal conductance thereof is decreased and heat-emitting ability is tended to deteriorate.

A platinum catalyst from 10 to 1000 ppm concentration in platinum conversion is preferably contained into the heat-emitting sheet 12 so that the active groups are easily bonded by the covalent bond between the heat-emitting sheet 12 and the plural Peltier elements 14, respectively. The platinum catalyst is exemplified by a platinum complex such as a platinum(0)-1,3-divinyl-1,1,3,3-tetramethyldisiloxane catalyst (Pt (dvs)) in 2.1 to 2.4% xylene solution (manufactured by Gelest Inc.). A silane-coupling agent including 2 to 6 units of a vinyl alkoxysilane unit having a vinylalkoxysilyl group, e.g. polyvinylmethoxysiloxane of 0.5 to 10 parts by weight of concentration is preferably included into the heat-emitting sheet 12. Thereby the vinyl group of the silane-coupling agent, and the vinyl group and/or the hydrogen siloxane group in silicone rubber polymer may be more strongly bonded by a covalent bond formed by the peroxide and the platinum catalyst. This covalent bond is different with the ether bond of the covalent bond. In this case, when the platinum catalyst is preferably included, the covalent bond may be easily formed.

Figure 2:
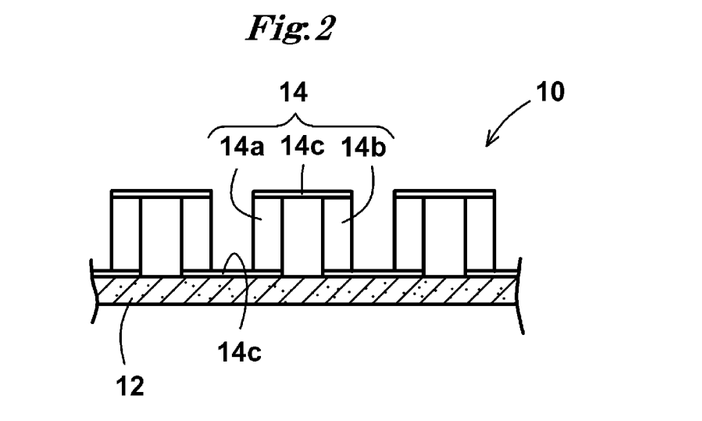
FIG. 2 is a partial cross-sectional view showing an embodiment of the flexible Peltier device of the present invention.

As shown in FIG. 2, a N-type semiconductor element 14a and a P-type semiconductor element 14b are connected in series through electrically conductive patterns 14c, 14c in the Peltier elements 14. According to the Peltier elements 14, a bonded surface between both of the N-type semiconductor element 14a and the P-type semiconductor element 14b (hereinafter it is designated as composed semiconductor elements), which compose the Peltier elements 14, and the heat-emitting sheet 12 is strongly bonded by molecular adhesion as a chemical bond which is directly formed by the covalent bond through between reactive active groups such as a hydroxy group (—OH) and/or a hydroxysilyl group (—SiOH). The preferred chemical bond is the ether bond by dehydration between OH groups.

A dry-type treatment exemplified by a corona treatment, a plasma treatment and an ultra violet treatment may be conducted to the whole or a part of at least any surfaces which become the bonded surfaces between the heat-emitting sheet 12 and the composed semiconductor elements. As long as irradiation of ultraviolet is conducted, the ultraviolet irradiation treatment is not restricted and may be a usual ultraviolet irradiation treatment (an UV treatment) which is irradiation of a broadband wavelength or multiple wavelengths and may be an excimer ultraviolet treatment (an excimer UV treatment) which is irradiation of excimer ultraviolet. The excimer ultraviolet may be seen as a single wavelength. According to the dry-type treatment, another active group can be generated further in addition to the active groups such as the hydroxy groups which originally exist on the surfaces thereof. The original active groups and the active groups generated by activation generate the covalent bond, specifically the ether bond, which is the strong covalent bond generated by the dehydration, at the opposed surface mutually. Accordingly, the heat-emitting sheet 12 and the composed semiconductor elements may be directly and chemically bonded.

The heat-emitting sheet 12 and the composed semiconductor elements may be bonded and integrated by the covalent bond through a molecular adhesive. According to a molecular adhesive treatment, since functional groups in the molecules of the molecular adhesive are chemically reacted with an adhesive body by forming the covalent bond, the each composed semiconductor element and the heat-emitting sheet 12 are directly bonded through the covalent bond by a single molecule or multiple molecules of the molecular adhesive molecules. The two functional groups of the molecular adhesive forms the covalent bond by chemically reacting, respectively, with the each composed semiconductor element and the heat-emitting sheet 12 which are the bodies being adhered. Molecules having ambifunctionality collectively mean the molecular adhesive, and specifically various coupling agents including the silane-coupling agents are exemplified.

As the molecular adhesive, more specifically, a compound having an amino group such as triethoxysilylpropylamino-1,3,5-triazine-2,4-dithiol (TES), aminoethylaminopropyltrimethoxy silane;

a triazine compound having a trialkoxysilylalkylamino group such as the triethoxysilylpropylamino group and a mercapto group or an azide group, a triazine compound represented by Formula (I) as following (I)

wherein W is a spacer group which for example may be the alkylene group or aminoalkylene group having optionally a substituted group or is directly bonded;

Y is an OH group or a reactive functional group which generates the OH group by hydrolysis or cleavage e.g. the trialkoxyalkyl group;

—Z is —$N_3$ or —$NR^1R^2$ ($R^1$ and $R^2$ are the same or different, and H or an alkyl group, —$R^3Si(R^4)_m(OR^5)_{3-m}$ [$R^3$ and $R^4$ are an alkyl group, $R^5$ is H or an alkyl group, m is 0 to 2]), incidentally, the alkylene group, alkoxy group and alkyl group are the chained, branched and/or cyclic hydrocarbon group having 1 to 12 carbon atoms which optionally has a substituted group;

a thiol compound having a trialkoxysilylalkyl group;

an epoxy compound having a trialkyloxysilylalkyl group;

a silane-coupling agent such as a vinylalkoxysiloxane polymer exemplified by $CH_2=CH-Si(OCH_3)_2-O-[Si(OCH_3)_2-O-]_n-Si(OCH_3)_2-CH=CH_2$ (n=1.8 to 5.7) are included.

In the molecular adhesive, as a silane-coupling agent having an alkoxy group without an amino group, an available silane-coupling agent is included. Particularly, a silane-coupling agent having a vinyl group and alkoxy group exemplified by vinylmethoxysilane (KBM-1003) and vinyltriethoxysilane (KBE-1003); a silane-coupling agent having an epoxy group and alkoxy group exemplified by 2-(3,4-epoxycyclohexyl)ethyltrimethoxysilane (KBM-303), 3-glycidoxypropyl methyldimethoxysilane (KBM-402), 3-glycidoxypropyl trimethoxysilane (KBM-403), 3-glycidoxypropyl methyldiethoxysilane (KBE-402), and 3-glycidoxypropyl triethoxysilane (KBE-403); a silane-coupling agent having a styryl group and alkoxy group exemplified by p-styryltrimethoxysilane (KBM-1403); a silane-coupling agent having a (meth)acryl group and alkoxy group exemplified by 3-methacryloxypropyl methyldimethoxysilane (KBM-502), 3-methacryloxypropyl methyldiethoxysilane (KBM-503), 3-methacryl oxypropyl methyldiethoxysilane (KBE-502), 3-methacryloxypropyl triethoxysilane (KBE-503), 3-acryloxypropyl trimethoxysilane (KBM-5103); a silane-coupling agent having an ureido group and alkoxy group exemplified by 3-ureidopropyltriethoxysilane (KBE-585); a silane-coupling agent having a mercapto group and alkoxy group exemplified by 3-mercaptopropylmethyldimethoxysilane (KBM-802) and 3-mercaptopropyltrimethoxysilane (KBM-803); a silane-coupling agent having a sulfide group and alkoxy group exemplified by bis(triethoxysilylpropyl) tetrasulfide (KBE-846); and a silane-coupling agent having an isocyanate group and alkoxy group exemplified by 3-isocyanatepropyltriethoxysilane (KBE-9007) (all of which is manufactured by Shin-Etsu Chemical Co., Ltd.; trade names) may be exemplified. Further, a silane-coupling agent having a vinyl group and acetoxy group exemplified by vinyltriacetoxysilane (Z-6075); a silane-coupling agent having an allyl group and alkoxy group exemplified by allyltrimethoxysilane (Z-6285); a silane-coupling agent having an alkyl group and alkoxy group exemplified by methyltrimethoxysilane (Z-6366), dimethyldimethoxysilane (Z-6329), trimethylmethoxysilane (Z-6013), methyltriethoxysilane (Z-6383), methyltriphenoxysilane (Z-6721), ethyltrimethoxysilane (Z-6321), n-propyltrimethoxysilane (Z-6265), diisopropyldimethoxysilane (Z-6258), isobutyltrimethoxysilane (Z-2306), diisobutyldimethoxysilane (Z-6275), isobutyltriethoxysilane (Z-6403), n-hexyltrimethoxysilane (Z-6583), n-hexyltriethoxysilane (Z-6586), cyclohexylmethyldimethoxysilane (Z-6187), n-octyltriethoxysilane (Z-6341), and n-decyltrimethoxysilane (Z-6210); a silane-coupling agent having an aryl group and alkoxy group exemplified by phenyltrimethoxysilane (Z-6124); a silane-coupling agent having an alkyl group and chlorosilane group exemplified by n-octyldimethylchlorosilane (ACS-8); a silane-coupling agent of an alkoxysilane exemplified by tetraethoxysilane (Z-6697) (all of which is manufactured by Dow Corning Toray Co., Ltd.; trade names) may be exemplified.

As the silane-coupling agent having the alkoxy group without the amino group, an alkoxysilyl compound having a hydrosilyl group (a SiH group) may be exemplified. For example, $(CH_3O)_3SiCH_2CH_2CH_2Si(CH_3)_2OSi(CH_3)_2H$,
$(C_2H_5O)_3SiCH_2CH_2CH_2Si(CH_3)_2OSi(CH_3)_2H$,
$(CH_3O)_3SiCH_2CH_2CH_2Si(OCH_3)_2OSi(OCH_3)_3$,
$(C_2H_5O)_3SiCH_2CH_2CH_2Si(OCH_3)_2OSi(OCH_3)_3$,
$(C_2H_5O)_3SiCH_2CH_2CH_2Si(CH_3)_2H$,
$(CH_3O)_3SiCH_2CH_2CH_2Si(CH_3)_2H$,
$(i-C_3H_7O)_3SiCH_2CH_2CH_2Si(CH_3)_2H$,
$(n-C_3H_7O)_3SiCH_2CH_2CH_2Si(CH_3)_2OSi(CH_3)_2CH_2CH_2Si(CH_3)_2Si(CH_3)_2H$,
$(n-C_4H_9O)_3SiCH_2CH_2CH_2Si(CH_3)_2OSi(CH_3)_2H$,
$(t-C_4H_9O)_3SiCH_2CH_2CH_2Si(CH_3)_2OSi(CH_3)_2H$,
$(C_2H_5O)_2CH_3SiCH_2CH_2CH_2Si(CH_3)_2OSi(CH_3)_2H$,
$(CH_3O)_2CH_3SiCH_2CH_2CH_2Si(CH_3)_2OSi(CH_3)_2CH_2CH_2Si(CH_3)_2Si(CH_3)_2H$,
$CH_3O(CH_3)_2SiCH_2CH_2CH_2Si(CH_3)_2OSi(CH_3)_2H$,
$(C_2H_5O)_3SiCH_2CH_2CH_2Si(CH_3)_2OSi(CH_3)_2H$,
$(n-C_3H_7)_3SiCH_2CH_2CH_2Si(CH_3)_2OSi(CH_3)_2H$,
$(i-C_3H_7O)_3SiCH_2CH_2CH_2Si(CH_3)_2OSi(CH_3)_2H$,
$(n-C_4H_9)_3SiCH_2CH_2CH_2Si(CH_3)_2OSi(CH_3)_2H$,
$(t-C_4H_9O)_3SiCH_2CH_2CH_2Si(CH_3)_2OSi(CH_3)_2H$,
$(C_2H_5O)_3SiCH_2CH_2CH_2Si(CH_3)_2OSi(CH_3)_2H$,
$(C_2H_5O)_3SiCH_2CH_2CH_2CH_2Si(CH_3)_2OSi(CH_3)_2H$,
$(C_2H_5O)_3SiCH_2CH_2CH_2CH_2CH_2CH_2CH_2CH_2CH_2CH_2Si(CH_3)_2OSi(CH_3)_2H$,
$(CH_3O)_3SiCH_2C_6H_4CH_2CH_2Si(CH_3)_2C_6H_4Si(CH_3)_2H$,
$(CH_3O)_2CH_3SiCH_2C_6H_4CH_2CH_2Si(CH_3)_2C_6H_4Si(CH_3)_2H$,
$CH_3O(CH_3)_2SiCH_2C_6H_4CH_2CH_2Si(CH_3)_2C_6H_4Si(CH_3)_2H$,
$(C_2H_5O)_3SiCH_2C_6H_4CH_2CH_2Si(CH_3)_2C_6H_4Si(CH_3)_2H$,
$(C_2H_5O)_3SiCH_2CH_2CH_2Si(CH_3)_2C_6H_4OC_6H_4Si(CH_3)_2H$,
$(C_2H_5O)_3SiCH_2CH_2CH_2Si(CH_3)_2C_2H_4Si(CH_3)_2H$,
$(C_2H_5O)_3SiCH_2CH_2CH_2Si(CH_3)_2O[Si(CH_3)_2O]_{p1}Si(CH_3)_2H$,
$C_2H_5O(CH_3)_2SiCH_2CH_2CH_2Si(CH_3)_2O[Si(CH_3)_2O]_{p2}Si(C_2H_5)_2H$,
$(C_2H_5O)_2CH_3SiCH_2CH_2CH_2Si(CH_3)_2O[Si(CH_3)_2O]_{p3}Si(CH_3)_2H$,
$(CH_3)_3SiOSiH(CH_3)O[SiH(CH_3)O]_{p4}Si(CH_3)_3$,
$(CH_3)_3SiO[(C_2H_5OSi(CH_3)CH_2CH_2CH_2)SiCH_3]O[SiH(CH_3)O]_{p5}Si(CH_3)_3$, $(CH_3)_3SiO[(C_2H_5OSiOCH_3CH_2CH_2CH_2)SiCH_3]O[SiH(CH_3)O]_{p6}Si(CH_3)_3$,
$(CH_3)_3SiO[(C_2H_5OSi(CH_3)CH_2CH_2CH_2)SiCH_3]O[SiH(CH_3)O]_{p7}Si(CH_3)_3$,
$(CH_3)_3SiO[(Si(OC_2H_5)_2CH_2CH_2CH_2)SiCH_3]O[SiH(CH_3)O]_{p8}Si(CH_3)_3$,
$(CH_3)_3SiOSi(OC_2H_5)_2O[SiH(CH_3)O]_{p9}[Si(CH_3)_2O]_{q1}Si(CH_3)_3$,
$(CH_3)_3SiO[(C_2H_5OSi(CH_3)CH_2CH_2CH_2CH_2CH_2CH_2)Si(CH_3)O][SiH(CH_3)O]_{p10}[Si(CH_3)_2O]_{q2}Si(CH_3)_3$,
$(CH_3)_3SiO[(Si(OCH_3)_3CH_2CH_2CH_2CH_2CH_2CH_2)Si(CH_3)O][SiH(CH_3)O]_{p11}[Si(CH_3)_2O]_{q3}Si(CH_3)_3$,
$(CH_3)_3SiOSi(OC_2H_5)_2O[SiH(C_2H_5)O]_{p12}Si(CH_3)_3$,
$(CH_3)_3SiO[(Si(OC_2H_5)_2CH_2CH_2CH_2CH_2CH_2CH_2)Si(C_2H_5)]O[SiH(C_2H_5)O]_{p13}Si(CH_3)_3$,
$(CH_3)_3SiO[(C_2H_5OSi(CH_3)CH_2CH_2CH_2CH_2CH_2CH_2)Si(C_2H_5)]O[SiH(C_2H_5)O]_{p14}Si(CH_3)_3$,
$C_2H_5OSi(CH_3)_2CH_2CH_2CH_2CH_2CH_2CH_2(CH_3)_2SiO[HSi(CH_3)_2OSiC_6H_5O]_{p15}Si(CH_3)_2H$,
$Si(OCH_3)_3CH_2CH_2CH_2CH_2CH_2CH_2(CH_3)_2SiO[HSi(CH_3)_2\ OSiC_6H_5O]_{p16}Si(CH_3)_2H$,
$H(CH_3)_2SiO[(C_2H_5OSi(CH_3)_2CH_2CH_2CH_2)Si(CH_3)O][HSiCH_3O]_{p17}Si(CH_3)_2H$,
$H(CH_3)_2SiO[(C_2H_5OSi(CH_3)_2CH_2CH_2CH_2CH_2)Si(CH_3)O][HSiCH_3O]_{p18}Si(CH_3)_2H$,
$H(CH_3)_2SiO[(C_2H_5OSi(CH_3)_2CH_2CH_2CH_2CH_2CH_2)Si(CH_3)O][HSiCH_3O]_{p19}Si(C\ H_3)_2H$,
$H(CH_3)_2SiO[(C_2H_5OSi(CH_3)_2CH_2CH_2CH_2CH_2CH_2CH_2CH_2)Si(CH_3)O][HSiCH_3O]_{p20}Si(CH_3)_2H$,
$H(CH_3)_2SiO[(C_2H_5OSi(CH_3)_2CH_2CH_2CH_2CH_2CH_2CH_2CH_2CH_2CH_2)Si(CH_3)O][H\ SiCH_3O]_{p21}Si(CH_3)_2H$,
$H(CH_3)_2SiO[(Si(OCH_3)_3CH_2CH_2C_6H_4CH_2CH_2)Si(CH_3)O][HSiCH_3O]_{p22}Si(CH_3)_2H$,
$H(CH_3)_2SiO[(Si(OCH_3)_3CH_2C_6H_4CH_2CH_2)Si(CH_3)O][HSiCH_3O]_{p23}Si(CH_3)_2H$,
$H(CH_3)_2SiO[(Si(OCH_3)_3CH_2C_6H_4CH_2CH_2)Si(CH_3)O][HSiCH_3O]_{p24}Si(CH_3)_2H$,
$H(CH_3)_2SiO[(Si(OCH_3)_3C_6H_4CH_2CH_2)Si(CH_3)O][HSiCH_3O]_{p25}Si(CH_3)_2H$,
$H(CH_3)_2SiO[(Si(OCH_3)_3CH_2CH_2CH_2)Si(CH_3)O][HSiCH_3O]_{p26}Si(CH_3)_2H$,
$H(CH_3)_2SiO[(Si(OCH_3)_3CH_2CH_2CH_2CH_2)Si(CH_3)O][HSiCH_3O]_{p27}Si(CH_3)_2H$,
$H(CH_3)_2SiO[(Si(OCH_3)_3CH_2CH_2CH_2CH_2CH_2CH_2)Si(CH_3)O][HSiCH_3O]_{p28}Si(CH_3)_2H$,
$H(CH_3)_2SiO[(Si(OCH_3)_3CH_2CH_2CH_2CH_2CH_2CH_2CH_2CH_2)Si(CH_3)O][HSiCH_3O]_{p29}Si\ (CH_3)_2H$,
$H(CH_3)_2SiO[(Si(OCH_3)_3CH_2CH_2CH_2CH_2CH_2CH_2CH_2CH_2CH_2)Si(CH_3)O][HSiC\ H_3O]_{p30}Si(CH_3)_2H$,
$H(CH_3)_2SiO[(Si(OCH_3)_3CH_2CH_2C_6H_4CH_2CH_2)Si(CH_3)O][HSiCH_3O]_{p31}Si(CH_3)_2H$,
$H(CH_3)_2SiO[(Si(OCH_3)_3CH_2C_6H_4CH_2CH_2)Si(CH_3)O][HSiCH_3O]_{p32}Si(CH_3)_2H$,
$H(CH_3)_2SiO[(Si(OCH_3)_3CH_2C_6H_4CH_2CH_2)Si(CH_3)O][HSiCH_3O]_{p33}Si(CH_3)_2H$,
$H(CH_3)_2SiO[(Si(OCH_3)_3C_6H_4CH_2CH_2)Si(CH_3)O][HSiCH_3O]_{p34}Si(CH_3)_2H$,
$H(CH_3)_2SiO[(Si(OCH_3)_3CH_2CH_2C_6H_4CH_2CH_2)Si(CH_3)O][HSiCH_3O]_{p35}Si(CH_3)_2H$,
$H(CH_3)_2SiO[(CH_3O)Si(CH_3)CH_2CH_2CH_2CH_2CH_2CH_2Si(CH_3)_2OSiC_6H_5O]_{p36}[HSi(CH_3)_2OSiC_6H_5O]_{p37}Si(CH_3)_2\ H$,
$H(CH_3)_2SiO[Si(OCH_3)_2CH_2CH_2CH_2CH_2CH_2Si(CH_3)_2\ OSiC_6H_5O]_{p37}[HSi(CH_3)_2O\ SiC_6H_5O]_{q5}Si(CH_3)_2\ H$,
$C_2H_5O(CH_3)_2SiO[SiH(CH_3)O]_{p38}[SiCH_3(C_6H_5)O]_{q6}Si(CH_3)_2H$,
$Si(OC_2H_5)_3CH_2CH_2CH_2CH_2CH_2CH_2(CH_3)_2SiO[SiH(CH_3)O]_{p39}[SiCH_3(C_6H_5)O]_{q7}Si(C\ H_3)_2H$,
$C_2H_5OSi(CH_3)_2CH_2CH_2CH_2CH_2CH_2CH_2(CH_3)_2SiO[SiH(CH_3)O]_{p40}[SiCH_3(C_6H_5)O]_{q8}Si(CH_3)_2H$,
$H(CH_3)_2SiO(C_2H_5O)Si(CH_3)O[SiH(CH_3)O]_{p41}[SiCH_3(C_6H_5)O]_{q9}Si(CH_3)_2H$ and
$H(CH_3)_2SiO[Si(OC_2H_5)_3CH_2CH_2CH_2Si(CH_3)]O[SiH(CH_3)O]_{p42}[SiCH_3(C_6H_5)O]_{q10}Si(CH_3)_2H$
are optionally used. In these groups, p1 to p42 and q1 to q10 are number of 1 to 100. The alkoxysilyl compound having the hydrosilyl group preferably has the hydrosilyl group of 1 to 99 in a monomolecular thereof.

As the silane-coupling agent having the alkoxy group without the amino group, an alkoxysilyl compound having a hydrosilyl group can be exemplified. For example,
$(C_2H_5O)_3SiCH_2CH=CH_2$,
$(CH_3O)_3SiCH_2CH_2CH=CH_2$,
$(C_2H_5O)_3SiCH_2CH_2CH=CH_2$,
$(CH_3O)_3SiCH_2CH_2CH_2CH=CH_2$,
$(C_2H_5O)_3SiCH_2CH_2CH_2CH_2CH=CH_2$,
$(C_2H_5O)_3SiCH_2CH_2CH_2CH_2CH_2CH=CH_2$,
$(CH_3O)_3SiCH_2(CH_2)_7CH=CH_2$,
$(C_2H_5O)_2Si(CH=CH_2)OSi(OC_2H_5)CH=CH_2$,
$(CH_3O)_3SiCH_2CH_2C_6H_4CH=CH_2$,
$(CH_3O)_2Si(CH=CH_2)O[SiOCH_3(CH=CH_2)O]_{t1}Si(OCH_3)_2CH=CH_2$,
$(C_2H_5O)_2Si(CH=CH_2)O[SiOC_2H_5(CH=CH_2)O]_{t2}Si(OC_2H_5)_3$,
$(C_2H_5O)_3SiCH_2CH_2CH_2Si(CH_3)_2OSi(CH_3)_2CH_2CH_2[Si(CH_3)_2O]_{t3}CH=CH_2$,
$(CH_3O)_3SiCH_2CH_2CH_2Si(CH_3)_2OSi(CH_3)_2CH_2CH_2[Si(CH_3)_2O]_{t4}CH=CH_2$,
$CH_3O(CH_3)_2SiCH_2CH_2CH_2Si(CH_3)_2OSi(CH_3)_2CH_2CH_2[Si(CH_3)_2O]_{t5}CH=CH_2$,
$(C_2H_5O)_2CH_3SiCH_2CH_2CH_2Si(CH_3)_2OSi(CH_3)_2CH_2CH_2[Si(CH_3)_2O]_{t6}CH=CH_2$,
$(C_2H_5O)_3SiCH_2CH_2CH_2Si(CH_3)_2OSi(CH_3)_2CH_2CH_2[Si(CH_3)_2O]_{t7}CH=CH_2$,
$(C_2H_5O)_3SiCH_2CH_2CH_2Si(CH_3)_2OSi(CH_3)_2CH_2CH_2(Si(CH_3)_3O)Si(CH_3)O[SiCH_3(-)O]_{u1}Si(CH_3)_3CH=CH_2$,
$(C_2H_5O)_3SiCH_2CH_2CH_2Si(CH_3)_2OSi(CH_3)_2CH_2CH_2(Si(CH_3)_3O)Si(CH_3)O[SiCH_3(-)O]_{u2}[Si(CH_3)_2O]_{t8}Si(CH_3)_3\ CH=CH_2$,
$(C_2H_5O)_2Si(CH=CH_2)O[SiCH_3(OC_2H)O]_{u3}Si(OC_2H_5)_2CH=CH_2$,
$(C_2H_5O)_2Si(CHCH_2)O[Si(OC_2H_5)_2O]_{u4}Si(OC_2H_5)_2CH=CH_2$ and
$(C_2H_5O)_2Si(CHCH_2)O[Si(OC_2H_5)_2O]_{u5}Si(OC_2H_5)_2CH=CH_2$
are optionally used. In these groups, t1 to t8 and u1 to u5 are number of 1 to 30. The alkoxysilyl compound having the hydrosilyl group has preferably the vinyl group of 1 to 30 in the monomolecular thereof.

The reaction of these vinyl groups and SiH groups may be accelerated by the metal catalyst, e.g. a compound including platinum and thus, the composed semiconductor elements and the heat-emitting sheet 12 may be bonded.

As the silane-coupling agent having the alkoxy group without the amino group, an alkoxysilyl compound having the alkoxysilyl group at both terminals may be exemplified. For example,
$(C_2H_5O)_3SiCH_2CH_2Si(OC_2H_5)_3$,
$(C_2H_5O)_2CH_3SiCH_2CH_2Si(OC_2H_5)_3$, (C$_2$H$_5$O)$_3$SiCHCHSi(OC$_2$H$_5$)$_3$,
(CH$_3$O)$_3$SiCH$_2$CH$_2$Si(OCH$_3$)$_3$(CH$_3$O)$_3$SiCH$_2$CH$_2$C$_6$H$_4$CH$_2$CH$_2$Si(OCH$_3$)$_3$,
(CH$_3$O)$_3$Si[CH$_2$CH$_2$]$_3$Si(OCH$_3$)$_3$,
(CH$_3$O)$_2$Si[CH$_2$CH$_2$]$_4$Si(OCH$_3$)$_3$,
(C$_2$H$_5$O)$_2$Si(OC$_2$H$_5$)$_2$,
(CH$_3$O)$_2$CH$_3$SiCH$_2$CH$_2$Si(OCH$_3$)$_2$CH$_3$,
(C$_2$H$_5$O)$_2$CH$_3$SiOSi(OC$_2$H$_5$)$_2$CH$_3$,
(CH$_3$O)$_3$SiO[Si(OCH$_3$)$_2$O]$_{v1}$Si(OCH$_3$)$_3$,
(C$_2$H$_5$O)$_3$SiO[Si(OC$_2$H$_5$)$_2$O]$_{v2}$Si(OC$_2$H$_5$)$_3$ and
(C$_3$H$_7$O)$_3$SiO[Si(OC$_3$H$_7$)$_2$O]$_{v3}$Si(OC$_3$H$_7$)$_3$ In these groups, v1 to v3 is number of 0 to 30.

As the silane-coupling agent having the alkoxy group without the amino group, an alkoxysilyl compound having a hydrolytic group-containing silyl group can be exemplified. For example, an easily-hydrolytic organosilane is optionally used. Particularly,
CH$_3$Si(OCOCH$_3$)$_3$, (CH$_3$)$_2$Si(OCOCH$_3$)$_2$, n-C$_3$H$_7$Si(OCOCH$_3$)$_3$, CH$_2$=CHCH$_2$Si(OCOCH$_3$)$_3$, C$_6$H$_5$Si(OCOCH$_3$)$_3$, CF$_3$CF$_2$CH$_2$CH$_2$Si(OCOCH$_3$)$_3$, CH$_2$=CHCH$_2$Si(OCOCH$_3$)$_3$, CH$_3$OSi(OCOCH$_3$)$_3$, C$_2$H$_5$OSi(OCOCH$_3$)$_3$, CH$_3$Si(OCOC$_3$H$_7$)$_3$, CH$_3$Si[OC(CH$_3$)=CH$_2$]$_3$, (CH$_3$)$_2$Si[OC(CH$_3$)=CH$_2$]$_3$, n-C$_3$H$_7$Si[OC(CH$_3$)=CH$_2$]$_3$, CH$_2$=CHCH$_2$Si[OC(CH$_3$)=CH$_2$]$_3$, C$_6$H$_5$Si[OC(CH$_3$)=CH$_2$]$_3$, CF$_3$CF$_2$CH$_2$CH$_2$Si[OC(CH$_3$)=CH$_2$]$_3$, CH$_2$=CHCH$_2$Si[OC(CH$_3$)=CH$_2$]$_3$, CH$_3$OSi[OC(CH$_3$)=CH$_2$]$_3$, C$_2$H$_5$OSi[OC(CH$_3$)=CH$_2$]$_3$, CH$_3$Si[ON=C(CH$_3$)C$_2$H$_5$]$_3$, (CH$_3$)$_2$Si[ON=C(CH$_3$)C$_2$H$_5$]$_2$, n-C$_3$H$_7$Si[ON=C(CH$_3$)C$_2$H$_5$]CH$_2$=CHCH$_2$Si[ON=C(CH$_3$)C$_2$H$_5$]$_3$, C$_6$H$_5$Si[ON=C(CH$_3$)C$_2$H$_5$]$_3$, CF$_3$CF$_2$CH$_2$CH$_2$Si[ON=C(CH$_3$)C$_2$H$_5$]$_3$, CH$_2$=CHCH$_2$Si[ON=C(CH$_3$)C$_2$H$_5$]$_3$, CH$_3$OSi[ON=C(CH$_3$)C$_2$H$_5$]$_3$, C$_2$H$_5$OSi[ON=C(CH$_3$)C$_2$H$_5$]]$_3$, CH$_3$Si[ON=C(CH$_3$)C$_2$H$_5$]$_3$, CH$_3$Si[N(CH$_3$)]$_3$, (CH$_3$)$_2$Si[N(CH$_3$)]$_2$, n-C$_3$H$_7$Si[N(CH$_3$)]$_3$, CH$_2$=CHCH$_2$Si[N(CH$_3$)]$_3$, C$_6$H$_5$Si[N(CH$_3$)]$_3$, CF$_3$CF$_2$CH$_2$CH$_2$Si[N(CH$_3$)]$_3$, CH$_2$=CHCH$_2$Si[N(CH$_3$)]$_3$, CH$_3$OSi[N(CH$_3$)]$_3$, C$_2$H$_5$OSi[N(CH$_3$)]$_3$ and CH$_3$Si[N(CH$_3$)]$_3$ are included.

As the silane-coupling agent containing the amino group and having the alkoxy group, an available silane-coupling agent is included. Particularly, an alkoxysilyl compound containing the amino group exemplified by N-2-(aminoethyl)-3-aminopropylmethyldimethoxysilane (KBM-602), N-2-(aminoethyl)-3-aminopropyltrimethoxysilane (KBM-603), N-2-(aminoethyl)-3-aminopropyltriethoxysilane (KBE-603), 3-aminopropyltrimethoxysilane (KBM-903), 3-aminopropyltriethoxysilane (KBE-903), 3-triethoxysilyl-N-(1,3-dimethyl-butylidene) propylamine (KBE-9103), N-phenyl-3-aminopropyltrimethoxysilane (KBM-573) and N-(vinylbenzyl)-2-aminoethyl-3-aminopropyltrimethoxysilane hydrochloride (KBM-575) (all of which is manufactured by Shin-Etsu Chemical Co., Ltd.; trade names) may be used. Further, an alkoxysilyl compound containing an amino group exemplified by 3-aminopropyltrimethoxy silane (Z-6610), 3-aminopropyltrimethoxy silane (Z-6611), 3-(2-aminoethyl)aminopropyltrimethoxy silane (Z-6094), 3-phenylaminopropyltrimethoxysilane (Z-6883), and N[3-(trimethoxy silyl)propyl]-N'-[(ethenylphenyl)methyl]-1,2-ethanediamine hydrochloride (Z-6032) (all of which is manufactured by Dow Corning Toray Co., Ltd.; trade names) may be used.

Only any one of the dry-type treatment and the molecular adhesive treatment may be conducted, and these treatments may be alternately and continuously conducted. For example, bonding thereof may be formed by only the dry-type treatment, by the molecular adhesive treatment following the dry-type treatment, and by the molecular adhesive treatment following the dry-type treatment and then the additional dry-type treatment. Further, bonding thereof may be formed by only the molecular adhesive treatment, by the molecular adhesive treatment following the dry-type treatment, and by the molecular adhesive treatment following the dry-type treatment and the additional dry-type treatment.

According to the flexible Peltier device 10 shown in FIG. 1, because the composed semiconductor elements of the Peltier device 14 and the heat-emitting sheet 12 made from the heat-conductive rubber having the flexibility are bonded and integrated by the direct covalent bond and/or the indirectly covalent bond through the molecular adhesive, they can be sufficiently bonded. When the heat-emitting sheet 12 is bent, worry of separation between the each composed semiconductor element of the Peltier element 14 and the heat-emitting sheet 12 is avoided. In addition, since the heat-emitting sheet 12 has superior heat diffusivity by improvement of heat transfer properties thereof, heat transfer properties between the each Peltier element 14 and an object to conduct heat are improved.

Figure 3:
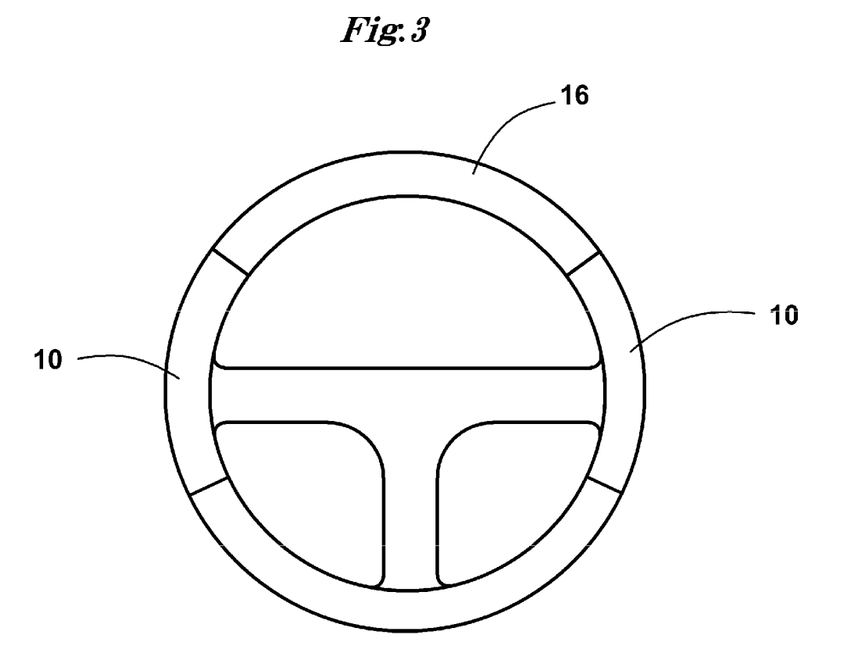
FIG. 3 is a front view showing a steering wheel provided with an embodiment of the temperature regulation apparatus of the present invention.
Figure 4:
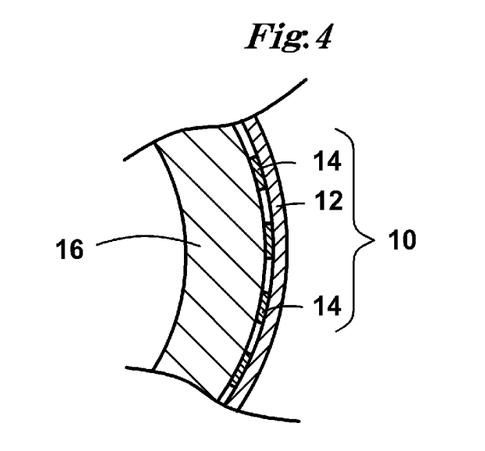
FIG. 4 is a partial cross-sectional view showing a steering wheel provided with an embodiment of the temperature regulation apparatus of the present invention.

A temperature regulation apparatus using the flexible Peltier device 10 shown in FIG. 1 is illustrated in FIG. 3. In the temperature regulation apparatus shown in FIG. 3, the flexible Peltier devices 10, 10 are attached to a steering wheel 16 of an automobile. The temperature regulation apparatus is intended to adjust a temperature of parts in the steering wheel gripped by hands as a temperature adjustment object. Since the heat-emitting sheet 12 has the flexibility, the whole flexible Peltier device 10 attached to the steering wheel 16 is attached to accommodate a curved surface of the steering wheel 16 while bending as shown in FIG. 4. The each composed semiconductor element is sufficiently bonded to the heat-emitting sheet 12 by the direct covalent bond and/or the indirect covalent bond through the molecular adhesive. The each composed semiconductor element therefore is not separated from the heat-emitting sheet 12, when the flexible Peltier device 10 is bent. Further, because the heat-emitting sheet 12 is made from the heat-conductive rubber, heat from the Peltier element 14 is conducted to the whole surface of the heat-emitting sheet 12, and emitted therefrom. The flexible Peltier device 10 for summer with the heat-emitting sheet 12 bonded to a cooling side of the Peltier elements 14 is attached to the steering wheel 16 so that the heat-emitting sheet 12 thereof contacts with the hands. In this case, even if the steering wheel 16 is hot by being exposed to sunshine in summer, the parts thereof gripped by the hands may be got ready in a cool state. The flexible Peltier device 10 for winter with the heat-emitting sheet 12 bonded to a heating side of the Peltier elements 14 is attached to the steering wheel 16 so that the heat-emitting sheet 12 thereof contacts with the hands. In this case, even if the steering wheel 16 is chilled in cold morning in winter, the parts thereof gripped by the hands may be got ready in a warm state. In the flexible Peltier device 10 attached to the steering wheel 16, when a distance between the plural Peltier devices 14 disposed on the heat-emitting sheet 12 is too short, the flexibility of the Peltier device is tended to detract. And when the distance is too long, it is tended to be difficult for regulation of temperature. The preferred distance therefore is 1 to 10 times of a side length of the Peltier element (more preferably from 2 to 5 times thereof). Skin feel of the heat-emitting sheet 12 of the flexible Peltier device 10 is good when the steering wheel 16 is gripped by the hands.

Figure 5:
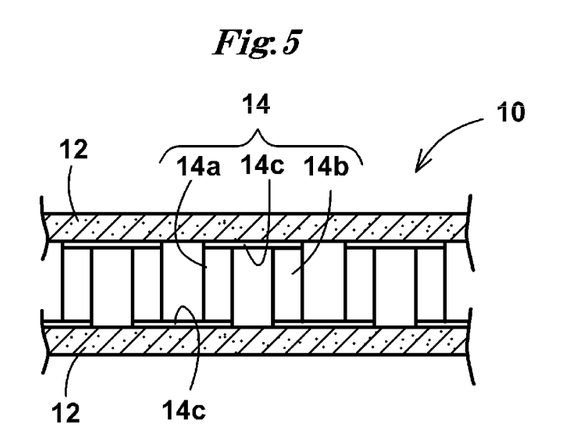
FIG. 5 is a partial cross-sectional view showing another embodiment of the flexible Peltier device of the present invention.
Figure 6:
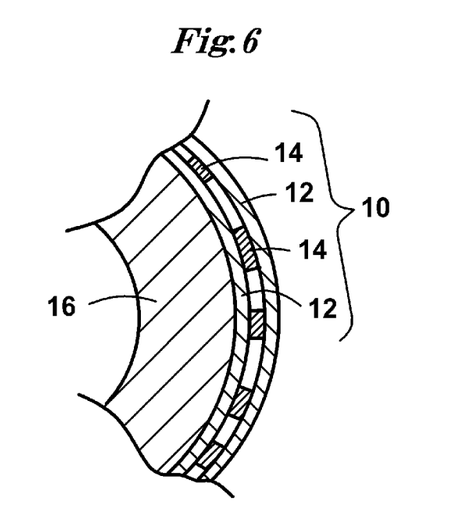
FIG. 6 is a partial cross-sectional view showing a steering wheel in which another embodiment of the temperature regulation apparatus of the present invention is attached hereto.

According to the flexible Peltier device 14 shown in FIGS. 1 to 4, the heat-emitting sheet 12 is bonded to either of the heating side or the cooling side of the Peltier elements 14. Then as shown in FIG. 5, the heat-emitting sheets 12 having the flexibility which is made from the heat-conductive rubber containing the heat conductive filler may be bonded to both of the heating side and the cooling side of the Peltier elements 14 by the molecular adhesive treatment. Since the heat-emitting sheets 12, 12 have the flexibility, the whole flexible Peltier device 10 shown in FIG. 5 is attached to accommodate the curved surface of the steering wheel 16 while bending as shown in FIG. 6. In the flexible Peltier device 10 shown in FIG. 5, the heat-emitting sheets 12, 12 is bonded to both of the heating side and the cooling side of the Peltier elements 14. When the flexible Peltier device 10 is attached to the steering wheel 16 so that the heat-emitting sheet 12 of the cooling side of the Peltier elements 14 contacts with the hands, the specific parts in the steering wheel 16 can be cool in summer. When the flexible Peltier device 10 is attached to the steering wheel 16 so that the heat-emitting sheet 12 of the heating side of the Peltier elements 14 contacts with the hands, the specific parts in the steering wheel 16 can be warm in winter.

Figure 7:
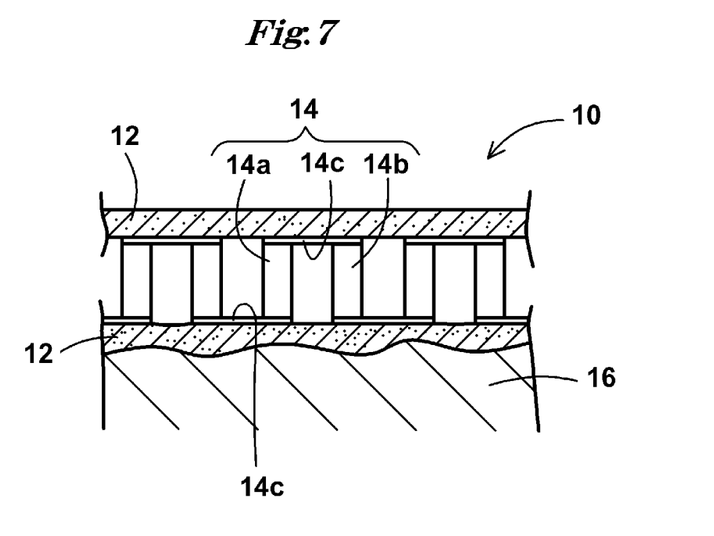
FIG. 7 is a partial cross-sectional view showing another embodiment of the flexible Peltier device of the present invention which is attached to a concave-convex surface.

As shown in FIG. 6, the flexible Peltier device 10 is attached to the steering wheel 16 so that the heat-emitting sheet 12 contacts therewith. In this case as shown in FIG. 7, even if an attachment surface of the steering wheel 16 has a concave-convex surface, the heat-emitting sheet 12 having the flexibility which is made from the heat-conductive rubber can accommodate the concave-convex surface and adhere thereto and thus, the flexible Peltier device 10 can be reliably attached to the concave-convex surface. In addition as shown in FIG. 8, by one side or both sides of the heat-emitting sheet 12 is provided with plural fin parts 12a, surface area thereof is expanded, and thus heat interchangeability may be improved.

Figure 8:
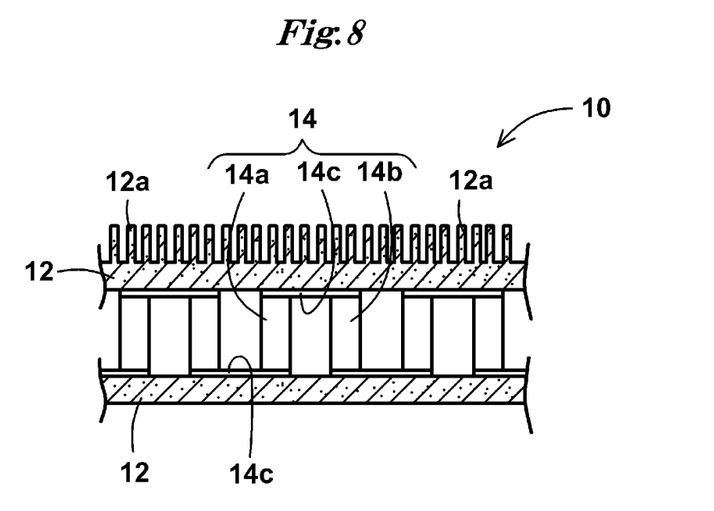
FIG. 8 is a partial cross-sectional view showing another embodiment of the flexible Peltier device of the present invention.

When the flexible Peltier device 10 shown in FIG. 2, 5 or 8 is attached to inside surface of a helmet or protective clothing so that cooling surface faces a human body, temperature-rising in the helmet or the protective clothing may be avoided in summer or at a high temperature area. Labor effectiveness in summer or at the high temperature area can be improved. When the flexible Peltier device 10 is attached to inside surface of snowsuit so that heating surface faces the human body, inside of the snowsuit may be quickly warm. Labor effectiveness in a cold space such as inside of a refrigerator can be improved.

The flexible Peltier device 10 explained above is used in adjustment of a temperature of the temperature adjustment object. When a difference of temperatures between the heating side and the cooling side of the Peltier element 14 is a specific value or more, voltage can be generated in the Peltier device 14 by the Seebeck effect. By the heat-emitting sheet 12 at the heating side of the flexible Peltier device is attached to a high temperature body and the heat-emitting sheet 12 at the cooling side thereof is attached to a low temperature body, power generation can be conducted by a difference of temperatures between both bodies. Moreover, the flexible Peltier device 10 explained above has the plural Peltier elements 14, whereas it may have the single Peltier element 14 depending on a size of the temperature adjustment object which should attach the flexible Peltier device 10.

EMBODIMENTS

Example 1

Figure 9:
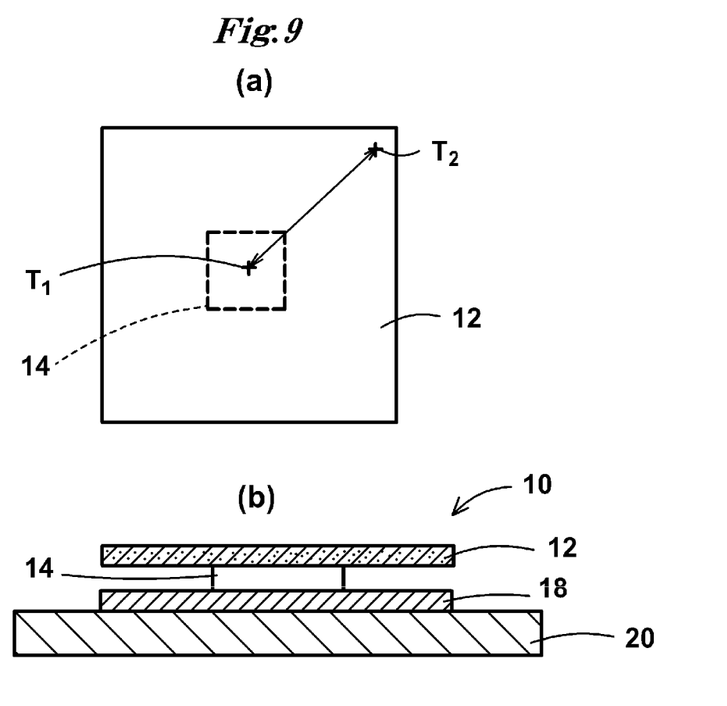
FIG. 9 is a front view and a cross-sectional view showing the flexible Peltier device of the present invention which is used in measurement of a temporal variation in a temperature of a heat-emitting sheet 12 which is bonded to a heating side of the Peltier element 14.

Magnesium oxide (MgO) and Aluminum oxide ($Al_2O_3$) as a heat conductive filler were added into a dimethylsilicone rubber, a sheet exhibiting flexibility made from a heat-conductive rubber was formed. The sheet had 0.5 mm thickness and 4.1 W/(m K) thermal conductivity. A square-shaped heat-emitting sheet 12 having a size of 20×20 mm was cut out from the sheet. As shown in FIG. 9(b), a heating side of each semiconductor element which composed a Peltier element 14 was bonded to one surface side of the heat-emitting sheet 12, and a flexible Peltier device 10 was prepared. Bonding of therebetween was carried out as follows. The Peltier element 14 was dipped into a vinyltriethoxysilane (KBE-1003) ethanol solution as a molecular adhesive, carried out with a heating treatment and washed with ethanol. The heating side of the Peltier element 14 and a dry-type treated surface of the heat-emitting sheet 12 treated by a corona discharge treatment were contacted and then, thermal compression bonding was conducted thereto. Furthermore, a sheet 18 without the heat conductive filler made from a dimethylsilicone rubber (0.2 W/(m K) thermal conductivity) bonded to a cooling side of the Peltier element 14 of the flexible Peltier device 10 and then, the resultant product was put on a cooling plate 20.

In the other side of the heat-emitting sheet 12 of the flexible Peltier device 10, a point corresponding to a center in the Peltier element 14 was $T_1$, a point positioned in a corner part in the heat-emitting sheet 12 was $T_2$. As shown in FIG. 9(a), Thermocouples were provided at $T_1$ and $T_2$, respectively, and then temperatures were measured by using a data logger. A linear distance between $T_1$ and $T_2$ was 14.14 mm.

Comparative Example 1

Figure 10:
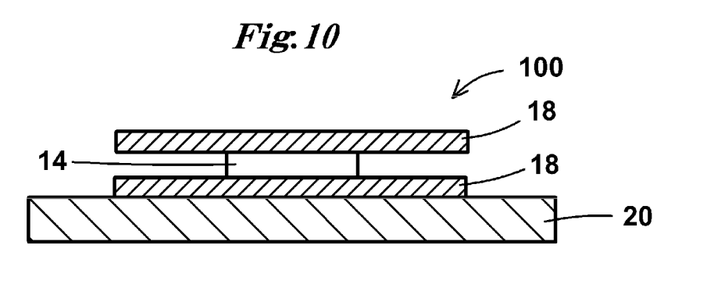
FIG. 10 is a cross-sectional view showing a Peltier device not applied with the present invention which is used in measurement of a temporal variation in a temperature of a sheet 18 containing no heat conductive filler which is bonded to a heating side of the Peltier element 14.

As shown in FIG. 10, a sheet 18 without the heat conductive filler made from the dimethylsilicone rubber treated a cross-linkage by an electron ray was bonded to the heating side of the Peltier element 14 shown in FIG. 9, as substituted for the heat-emitting sheet 12 bonded thereto. A flexible Peltier device 100 was prepared. The thermocouples were provided at $T_1$ and $T_2$ on the other side of the sheet 18 which was bonded to the heating side of the Peltier element 14 in the same manner as Example 1, respectively, and then temperatures were measured by using the data logger.

Example 2 and Comparative Example 2

Figure 11:
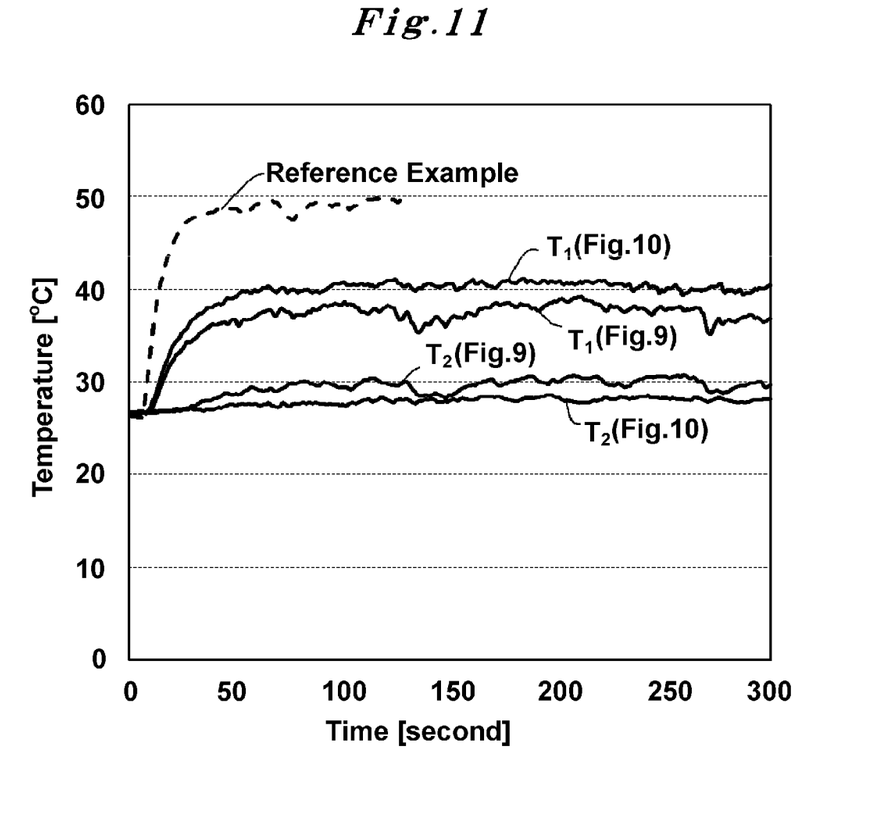
FIG. 11 is a graph showing measurement results of the temporal variation in the temperature of the heat-emitting sheet 12 or the sheet 18 containing no heat conductive filler which is bonded to the heating side of the Peltier element 14.

A current was passed through the Peltier element 14 of the flexible Peltier device 10 shown in FIG. 9. Temporal variations in temperatures of $T_1$ and $T_2$ of the heat-emitting sheet 12 were measured. Obtained results thereof are shown in FIG. 11. Further, a current was passed through the Peltier element 14 of the flexible Peltier device 100 shown in FIG. 10. Temporal variations in temperatures of $T_1$ and $T_2$ of the sheet 18 were measured. Obtained results thereof are shown in FIG. 11 with the above results. A temporal variation in a temperature of the heating side surface of the Peltier element 14 which was exposed is shown in FIG. 11 by a broken line just for reference.

As seen from FIG. 11, when the heating side surface of the Peltier element 14 is exposed, the temperature thereof is reached to 50° C. or more. The temperatures of $T_1$ are reached below 40° C. or more by bonding the heat-emitting sheet 12 or the sheet 18 to the heating side surface. Heat diffuseness is occurred by the heat-emitting sheet 12 or the sheet 18. In addition, the temperatures of $T_1$ and $T_2$ in both FIGS. 9 and 10 are plateaued within 60 seconds from the start of passing the current. In the temperatures of $T_1$, FIG. 9 is lower than FIG. 10. Furthermore in the temperatures of $T_2$, FIG. 9 is higher than FIG. 10. When the temperature difference ΔT ($T_{1\ ave}$–$T_{2\ ave}$) is determined by calculating the average temperatures $T_{1\ ave}$ and $T_{2\ ave}$, which are $T_1$ and $T_2$ in 60 to 300 seconds from the start of passing the current, the temperature difference ΔT of the flexible Peltier device 10 shown in FIG. 9 is 8° C., and the temperature difference ΔT of the flexible Peltier device 100 shown in FIG. 10 is 12° C. The flexible Peltier device 10 shown in FIG. 9 exhibits superior heat dispersion compared to the flexible Peltier device 100 shown in FIG. 10.

Example3

Figure 12:
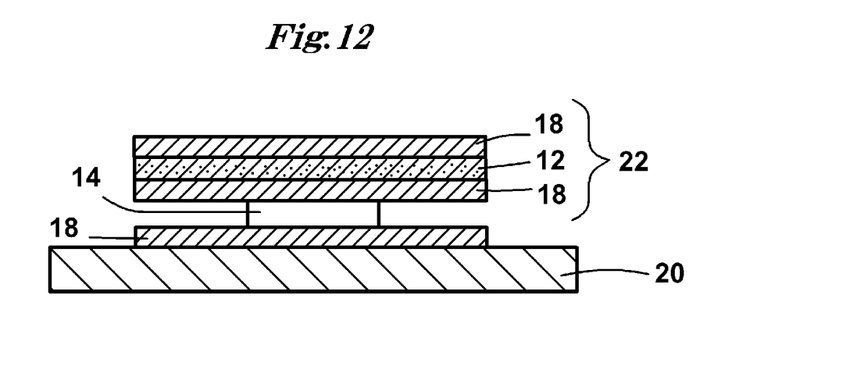
FIG. 12 is a cross-sectional view a Peltier device applied with the present invention which is used in measurement of a temporal variation of a temperature of a three-stacked structure 22 which is bonded to a heating side of the Peltier element 14.
Figure 13:
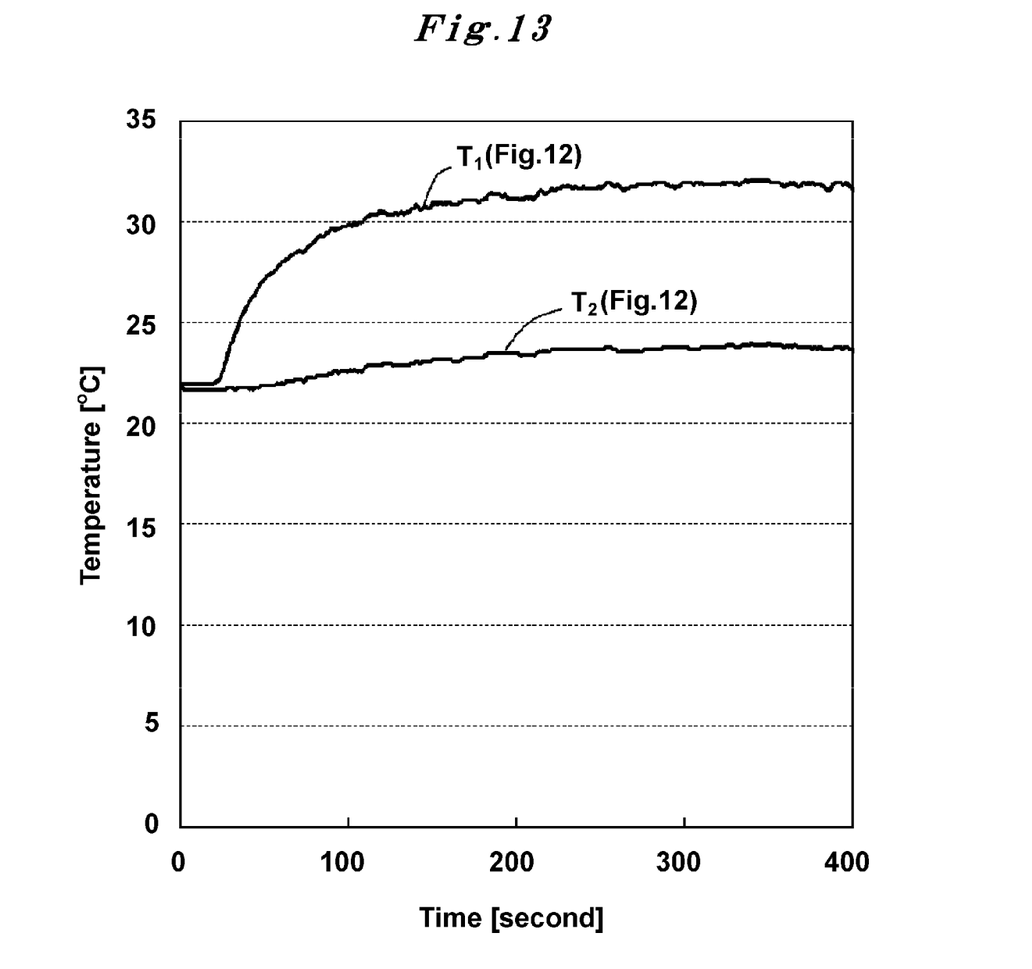
FIG. 13 is a graph showing measurement results of a temporal variation in a temperature of a three-stacked structure 22 which is bonded to the heating side of the Peltier element 14.

As shown in FIG. 12, a three-stacked structure 22 having the heat-emitting sheet 12 sandwiched between the sheets 18, 18 without the heat conductive filler was bonded to the heating side of the Peltier element 14 shown in FIG. 10. A flexible Peltier device 10 was prepared. The thermocouples were provided at $T_1$ and $T_2$ of the top layer sheet 18 in the same manner as Comparative Example 1, respectively. Temperatures were measured by using the data logger. Obtained results are shown in FIG. 13. As seen in FIG. 13, the temperatures of $T_1$ and $T_2$ smoothly vary with time, whereas a period of time from the start of passing current to reaching a plateaued state between the temperatures $T_1$ and $T_2$ is long as approximately 200 seconds. When the temperatures $T_1$ and $T_2$ are reached the plateaued state, the temperature difference ΔT is 8° C.

INDUSTRIAL APPLICABILITY

The flexible Peltier device and the temperature regulation apparatus can be attached to a curved surface of a temperature adjustment object such as a steering wheel, a helmet and protective clothing, and can expeditiously adjust a temperature of the temperature adjustment object.

EXPLANATIONS OF LETTERS OR NUMERALS

Numerals mean as follows. 1, 100: flexible Peltier device, 12: heat-emitting sheet, 12a: fin part, 14: Peltier element, 14a: N-type semiconductor element, 14b: P-type semiconductor element, 14c: electrically conductive pattern, 16: steering wheel, 18: sheet, 20: cooling plate, 22: three-stacked structure

What is claimed is:

1. A flexible Peltier device comprising:
a heat-emitting sheet having flexibility made from heat-conductive rubber containing a heat conductive filler and formed by crosslinked silicone rubber and/or blended rubber made from the crosslinked silicone rubber and non-silicone rubber,
two rubber sheets each without a heat conductive filler, formed by crosslinked silicone rubber and/or blended rubber made from the crosslinked silicone rubber and non-silicone rubber,
a stacked structure having the heat-emitting sheet sandwiched between the two rubber sheets,
at least one Peltier element having a heating side surface and a cooling side surface by being composed of a plurality of a N-type semiconductor element and a plurality of a P-type semiconductor element, which is contacted by its heating side surface with one of the two rubber sheets of the stacked structure and disposed thereon, and
a third rubber sheet without a heat conductive filler, formed by crosslinked silicone rubber and/or blended rubber made from the crosslinked silicone rubber and non-silicone rubber, which is contacted by the cooling side surface of the at least one Peltier element.

2. A temperature regulation apparatus comprising:
the flexible Peltier device according to claim 1, which is capable of being attached to accommodate a curved surface of a temperature adjustment object.

3. The temperature regulation apparatus according to claim 2, comprising a plurality of the at least one Peltier element.

4. The temperature regulation apparatus according to claim 3, wherein the plurality of the at least one Peltier element are disposed on the one side surface of the stacked structure through intervals with a predetermined distance.

5. The temperature regulation apparatus according to claim 2, wherein the heat-conductive rubber contains a metal oxide and/or a metal nitride as the heat conductive filler, and thermal conductivity of the heat-emitting sheet is 1 W/m K or more.

6. The temperature regulation apparatus according to claim 2, wherein the heat-emitting sheet has a thickness of 0.01 to 10 mm.

* * * * *